(12) United States Patent
Furuya et al.

(10) Patent No.: US 7,332,966 B2
(45) Date of Patent: Feb. 19, 2008

(54) HIGH FREQUENCY POWER AMPLIFIER CIRCUIT

(75) Inventors: Tomio Furuya, Tamamura (JP); Kazuhiko Ishimoto, Komoro (JP); Hiroyuki Tanaka, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 138 days.

(21) Appl. No.: 11/371,048

(22) Filed: Mar. 9, 2006

(65) Prior Publication Data

US 2006/0214729 A1     Sep. 28, 2006

(30) Foreign Application Priority Data

Mar. 22, 2005    (JP) .............................. 2005-081028

(51) Int. Cl.
*H03G 3/30*    (2006.01)
(52) U.S. Cl. ...................................... 330/289; 330/285
(58) Field of Classification Search ................ 330/285, 330/289

See application file for complete search history.

(56) References Cited

U.S. PATENT DOCUMENTS 6,998,919 B2 *    2/2006  Gamero et al. ............. 330/289

FOREIGN PATENT DOCUMENTS

| JP | 200-151310 | 5/2000 |
|----|------------|--------|
| JP | 2003-243994 | 8/2003 |

* cited by examiner

*Primary Examiner*—Steven J. Mottola
(74) *Attorney, Agent, or Firm*—Mattingly, Stanger, Malur & Brundidge PC

(57) ABSTRACT

A high frequency power amplifier circuit includes amplifying devices whose control terminals (gate or base terminals) are supplied with a bias voltage. The high frequency power amplifier circuit keeps constant the bias voltage so that the amplifying devices operate in a saturation region. The high frequency power amplifier circuit controls an operating power supply voltage supplied to the amplifying devices in accordance with an output request level to control output power. A device (diode) having temperature dependency is provided for an operating power supply voltage control circuit that controls the operating power supply voltage for the amplifying devices in accordance with the output request level. The operating power supply voltage control circuit is configured to generate the operating power supply voltage corresponding to the device's temperature characteristics and supply it to the amplifying devices.

10 Claims, 6 Drawing Sheets

HIGH FREQUENCY POWER AMPLIFIER CIRCUIT

CROSS-REFERENCE TO RELATED APPLICATION

The present application claims priority from Japanese patent application No. 2005-081028 filed on Mar. 22, 2005, the content of which is hereby incorporated by reference into this application.

BACKGROUND OF THE INVENTION

The present invention relates to the technology effectively applied to a high frequency power amplifier circuit that amplifies and outputs high-frequency signals. More specifically, the present invention relates to the technology effectively applied to an open-loop high frequency power amplifier circuit that controls an amplifying transistor's operating power supply voltage (power supply voltage) in accordance with output request levels to control output power. For example, the present invention relates to the technology effectively utilized for a high frequency power amplifier circuit used for cellular phones and electronic parts (power modules) including that circuit.

Generally, the transmitting output portion in a radio communication apparatus (mobile communication apparatus) such as a cellular phone is provided with a high frequency power amplifier circuit (power amplifier) to amplify modulated transmission signals. A conventional radio communication apparatus uses an APC (Automatic Power Control) circuit to control the high frequency power amplifier circuit's gain in accordance with transmission request levels supplied from a base station. The APC circuit detects an output power from the high frequency power amplifier circuit or an antenna and generates a transmission output control signal based on the detected signal and an output level designation signal from a baseband circuit and the like. The conventional radio communication apparatus is configured to control bias voltages for the high frequency power amplifier circuit so that a control voltage output from the APC circuit provides an output power needed for conversation (e.g., see patent document 1)

Conventional communication systems for cellular phones include GSM (Global System for Mobile Communication). The GSM system uses a phase modulation system called GMSK (Gaussian Minimum Shift Keying) that shifts carrier wave phases in accordance with transmission data. The GSM-based communication system only needs to amplify and output phase-modulated signals in accordance with requested output levels. Generally, a GSM-based cellular phone generally fixes the input signal amplitude, allows a bias circuit to control idle currents for amplifying devices in the high frequency power amplifier circuit in accordance with request output levels, and feedback controls the output power. This control system is generally referred to as the closed-loop system.

However, the APC circuit needs to be provided for the output power control system according to the above-mentioned closed-loop system. Provision of the APC circuit increases the circuit scale and decreases the packaging density. To solve this problem, there is disclosed the system (e.g., see patent document 2) that controls an operating power supply voltage (power supply voltage) of the amplifying device (power FET) so that an output level varies based on and in proportion to a signal that designates the output level. In this manner, the system linearly operates the amplifying device to ensure linearity of outputs from the high frequency power amplifier circuit. This system is called the open-loop system and provides an advantage of providing a smaller circuit scale that the closed-loop system.

Japanese Unexamined Patent Publication No. 2000-151310

Japanese Unexamined Patent Publication No. 2003-243994

SUMMARY OF THE INVENTION

Under power control according to the conventional open-loop high frequency power amplifier circuit, a bias voltage is applied to a control terminal (gate or base terminal) of the amplifying device and is set so that the amplifying device operates in a saturation region. The power supply control system employed controls an output power level (power) by varying a power supply voltage applied to the drain or collector terminal of the amplifying device in proportion to signal Vramp that designates transmission output levels. A bias circuit for supplying the amplifying device with bias voltages is composed of a current generation circuit for generating currents with specified magnitudes, a circuit for transforming a generated current into a voltage, and the like. Finally, resistance division or current mirroring is provided to supply a bias to the control terminal of the amplifying device.

Under power control according to the conventional open-loop high frequency power amplifier circuit, however, the output power varies with temperature even though a constant bias voltage is applied to the amplifying device's control terminal. Specifically, the higher the temperature becomes, the lower the output power becomes.

A possible cause is the temperature dependency of saturation voltage in the transistor as the amplifying device. The saturation voltage varies with temperature. Especially during a low output, the power supply voltage for the amplifying device approximates to the saturation voltage. An effect of the saturation voltage becomes more remarkable. In addition, a higher saturation voltage results from a higher temperature. Consequently, as shown in FIG. 4, a low output at high temperature causes a large deviation from the expected characteristic of output power Pout. In FIG. 4, solid line A depicts the characteristic of output power Pout at room temperature, i.e., when no temperature dependency is assumed. Dot-dash line B depicts the characteristic of output power Pout at temperature 85°.

It is necessary to prevent the output power from changing due to the temperature dependency of the amplifying device. For this purpose, a temperature detection circuit is provided. In addition, the baseband circuit is provided with table data that indicates the relationship between temperature and output level designation signal Vramp supplied from the baseband circuit to a high-frequency IC. A possible counter measure for temperature compensation is that software for the baseband circuit may be used to vary output level designation signal Vramp in accordance with temperature changes. However, such countermeasure increases a burden to users (set makers) who develop the software for baseband circuits.

It is therefore an object of the present invention to provide a technology capable of preventing output power (power) from varying despite a change in the ambient temperature, i.e., decreasing the temperature dependency of output power in a high frequency power amplifier circuit that applies constant bias voltage to an amplifying device's control terminal and controls operating power supply voltage (power supply voltage) in accordance with output request levels to control the output power.

It is another object of the present invention to provide an output power control technology capable of decreasing the temperature dependency of output power without increasing burden to set makers in a high frequency power amplifier circuit that applies constant bias voltage to an amplifying device's control terminal and controls operating power supply voltage (power supply voltage) in accordance with output request levels to control the output power.

These and other objects and novel features of the invention may be readily ascertained by referring to the following description and appended drawings.

The following describes an overview of representative means of the invention disclosed in this application.

A high frequency power amplifier circuit includes amplifying devices whose control terminals (gate or base terminals) are supplied with a bias voltage. The high frequency power amplifier circuit keeps constant the bias voltage so that the amplifying devices operate in a saturation region. The high frequency power amplifier circuit controls an operating power supply voltage supplied to the amplifying devices in accordance with an output request level to control output power. A device having temperature dependency is provided for an operating power supply voltage control circuit that controls the operating power supply voltage for the amplifying devices in accordance with the output request level. The operating power supply voltage control circuit is configured to generate the operating power supply voltage corresponding to the device's temperature characteristics and supply it to the amplifying devices. The operating power supply voltage generated by the operating power supply voltage control circuit is applied to an amplifying device at least at the last stage. That operating power supply voltage may be applied to all amplifying devices when the high frequency power amplifier circuit is configured to be multiple stages composed of serially connected multiple amplifying devices.

The circuit to generate the operating power supply voltage applied to the amplifying devices may include a differential amplifier and a transistor. For example, the differential amplifier receives a signal to designate an output level at its one input terminal and is applied with a specified offset voltage generated from an offset generation circuit at its other terminal. The transistor outputs a current driven by an output from the differential amplifier. The offset generation circuit may be provided with a device having temperature dependency. The device's temperature characteristics may be used to shift the differential amplifier's offset voltage.

The output power may deviate from an expected value when a temperature change varies the saturation voltage for the amplifying devices operating in the saturation region. Even in such case, the above-mentioned means vary the operating power supply voltage applied to the amplifying devices so as to compensate the deviation. Accordingly, it is possible to suppress variations in the output power due to temperature changes. The high frequency power amplifier circuit automatically controls operating power supply voltages for the amplifying devices against temperature changes. The temperature compensation is available without using baseband circuit software to vary the output level designation signal Vramp supplied to a high-frequency IC in accordance with temperature changes. This makes it possible to decrease the temperature dependency of output power without increasing a burden to set makers.

The following summarizes effects provided by the representative means of the invention disclosed in this application.

The present invention can prevent the output power (power) from varying despite a change in the ambient temperature in a high frequency power amplifier circuit that applies constant bias voltage to the amplifying device's control terminal and controls operating power supply voltage (power supply voltage) in accordance with output request levels to control the output power. Since no software-based temperature compensation is needed, it is possible to decrease the temperature dependency of output power without increasing burden to set makers.

BRIEF DESCRIPTION OF THE DRAWINGS

FIGS. 2(A), 2(B), and 2(C) are graphs, in which FIG. 2(A) is a graph showing relationship between temperature and potential V2 at node N2 in an offset provision circuit constructing an operating power supply voltage control portion according to the embodiment, FIG. 2(B) is a graph showing relationship between temperature and currents 11 and 12 flowing through MOSFETs Q1 and Q2, and FIG. 2(C) is a graph showing relationship between temperature and offset voltage Voff applied to a non inverting input terminal of a differential amplifier AMP0 for a power supply circuit;

DETAILED DESCRIPTION OF THE PREFERRED EMBODIMENTS

Embodiments of the present invention will be described in further detail with reference to the accompanying drawings.

Figure 1:
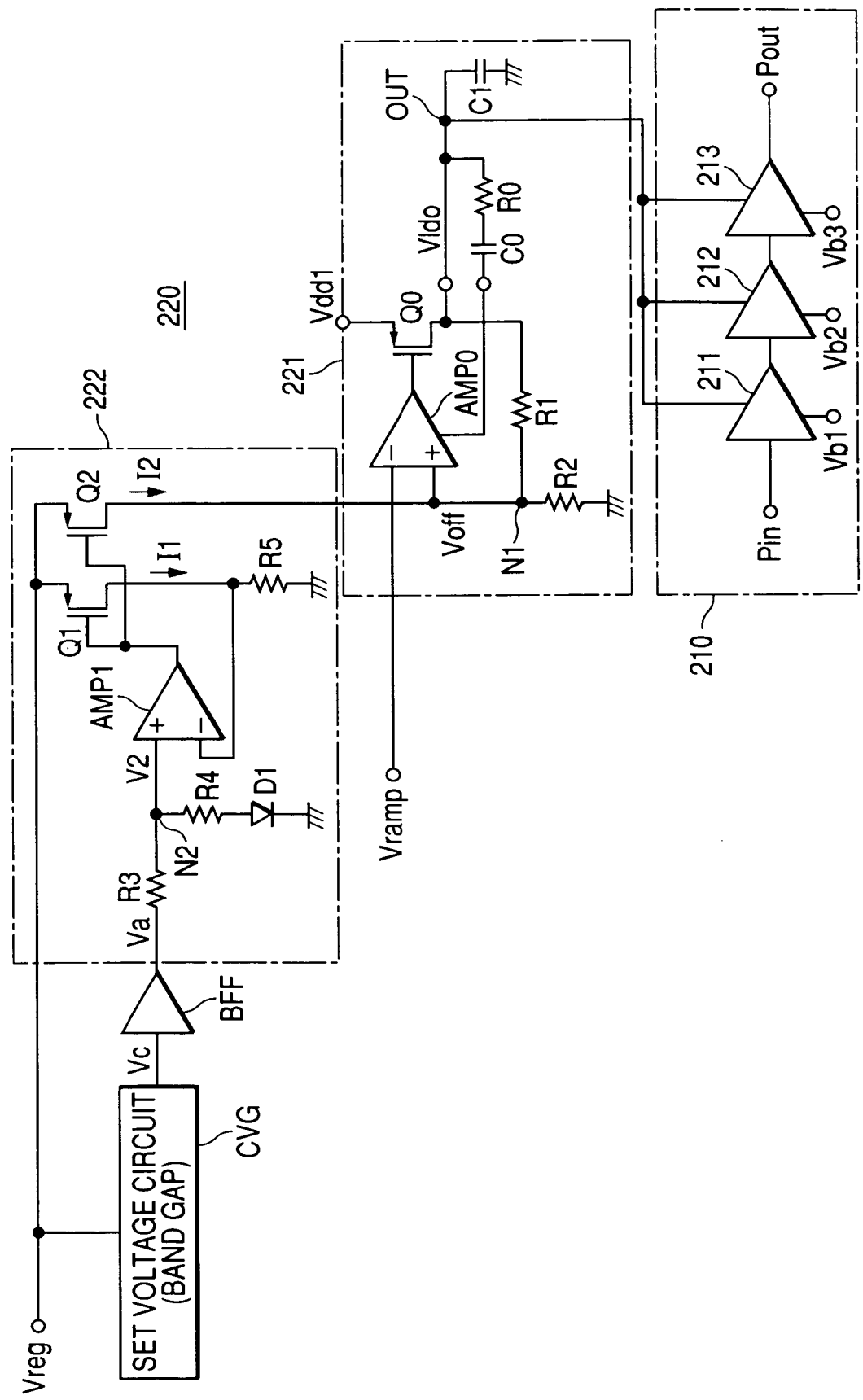
FIG. 1 is a circuit configuration diagram showing an embodiment of the high frequency power amplifier circuit according to the present invention.

FIG. 1 shows an embodiment of a high frequency power amplifier composed of a high frequency power amplifier circuit according to the present invention and an operating power supply voltage control circuit (variable operating power supply voltage generation circuit) that generates operating power supply voltage and controls the output power.

A high frequency power amplifier circuit 210 of the high frequency power amplifier according to the embodiment is composed of serially connected three amplification stages 211, 212, and 213 each including amplifying devices such as an FET and a bipolar transistor. A bias circuit (not shown) applies set bias voltages Vb1, Vb2, and Vb3 to control terminals (gate or base terminals) of the amplification stage 211, 212, and 213. The set bias voltages Vb1, Vb2, and Vb3 are set to such levels that allow the amplifying transistors of the amplification stages 211, 212, and 213 to operate in saturation regions. Normally, the set bias voltages are set to be Vb1<Vb2<Vb3.

An operating power supply voltage control circuit 220 is composed of a power supply circuit 221 and an offset provision circuit 222. The power supply circuit 221 has a differential amplifier AMP0 whose inverting input terminal receives output level designation signal Vramp supplied from a baseband circuit (not shown). The power supply circuit 221 generates operating power supply voltage Vdd for the above-mentioned amplification stages 211, 212, and 213 in accordance with Vramp. The offset provision circuit 222 generates offset voltage Voff applied to an non inverting input terminal of the differential amplifier AMP0.

The power supply circuit 221 controls output power Pout by supplying the amplification stages 211, 212, and 213 with operating power supply voltage vdd1 corresponding to output level designation signal Vramp. For this purpose, the power supply circuit 221 is composed of the differential amplifier AMP0, an output transistor Q0, a stabilization capacitor C1, resistors R1 and R2, a resistor R0, and a capacitor C0. The differential amplifier AMP0 uses its inverting input terminal to receive output level designation signal Vramp. The output transistor Q0 is composed of a P-channel MOSFET (Metal Oxide Silicon Field Effect Transistor) whose source terminal is connected to power supply voltage Vdd1, drain terminal is connected to output terminal OUT, and gate terminal receives output from the differential amplifier AMP0. The stabilization capacitor C1 is connected to the output terminal OUT. The resistors R1 and R2 are serially connected between the Q0's drain terminal and a ground point. The resistor R0 and the capacitor C0 are connected between the output terminal OUT and an internal node of the differential amplifier AMP0 and are used for phase compensation. Of these devices, the stabilization capacitor C1, and the resistor R0 and the capacitor C0 for phase compensation are connected outside a semiconductor chip where the differential amplifier AMP0 is formed.

A potential at the connection node N1 between the resistors R1 and R2 is applied to the non inverting input terminal of the differential amplifier AMP0. The differential amplifier AMP0 drives the output MOSFET Q0 so that the potential at the connection node N1 between the resistors R1 and R2 matches the output level designation signal Vramp. In this manner, the drain voltage of the output MOSFET Q0 is proportional to the output level designation signal Vramp and is lower than the power supply voltage Vdd1 for a voltage drop due to the on-state resistance. The drain voltage is smoothed by the stabilization capacitor C1 and is supplied as the operating power supply voltage Vldo to the amplification stages 211 through 213.

The following describes the reason why a potential at the connection node N1 between the resistors R1 and R2 is applied to the non inverting input terminal of the differential amplifier AMP0. That is, even though the baseband circuit tries to reset the output power to "0", the output level designation signal Vramp may not be completely reset to 0 V due to manufacturing variations and the like. This may cause the power supply circuit 221 to output the operating power supply voltage Vldo at a more superior level and allow the amplification stages 211 through 213 to amplify. An offset is given to prevent this situation.

The offset provision circuit 222 is composed of a set voltage circuit CVG, a differential amplifier AMP1, a P-channel MOSFET Q1, and a P-channel MOSFET Q2. The set voltage circuit CVG is similar to a band gap reference circuit that generates constant voltage Vc independent of the power supply voltage and temperature. The differential amplifier AMP1 uses its non inverting input terminal to receive a constant voltage from the set voltage circuit CVG via a buffer BFF for impedance transformation. The P-channel MOSFET Q1 has its source terminal connected to power supply voltage Vreg, drain terminal connected to the ground point via a resistor R5, and gate terminal that receives an output potential from the differential amplifier AMP1. The P-channel MOSFETQ2 has its gate terminal that receives the same voltage as the gate voltage of Q1. The offset provision circuit 222 and the resistor R2 in the power supply circuit 221 construct an offset generation circuit.

The offset provision circuit 222 according to the embodiment may use FETs for the amplification stages 211 through 213. The transistor Q1 in FIG. 1 is equivalent to an output-stage transistor in a differential amplifier composed of a differential amplification portion and an output stage. It may be preferable to use an ordinary differential amplifier composed of a differential amplification portion and an output stage for the differential amplifier AMP1 and apply its output to the gate terminal of the transistor Q1.

The offset provision circuit 222 in FIG. 1 feeds the Q1 train voltage back to the inverting input terminal of the differential amplifier AMP1. The differential amplifier AMP1 then drives the MOSFET Q1 so that the Q1 drain voltage matches the input voltage at the non inverting input terminal. The P-channel MOSFET Q2 uses its gate terminal to receive the same voltage as the Q1 gate voltage. The MOSFET Q2 is designed to ensure a size ratio of 1:m with respect to Q1. Let us assume that Q1 is applied with current I1. Then, Q2 is applied with I2, i.e., I1 multiplied by m (=mI1).

Resistors R3 and R4 and a PN junction diode D1 are serially connected between an output terminal of the buffer BFF and the ground point. Forward voltage Vf of the PN junction diode D1 has negative temperature characteristics. A potential for the connection node N2 between the resistors R3 and R4 is applied to the non inverting input terminal of the differential amplifier AMP1. In the offset provision circuit 222 according to the embodiment, the following equation is used to find V2, i.e., the potential for the connection node N2 between the resistors R3 and R4. This potential is applied to the non inverting input terminal of the differential amplifier AMP1. Further, in the following equation, it is assumed that Va is an output voltage of the buffer BFF, r3 and r4 denote resistance values of the resistors R3 and R4, VF denotes the forward voltage of the diode D1, and T is a temperature variable.

$$V2 = \{r4/(r3+r4)\} \cdot (Va - VF) + VF \quad (1)$$
$$= \{r4/(r3+r4)\} \cdot Va - \{r4/(r3+r4)\} \cdot VF + VF$$
$$= \{r4/(r3+r4)\} \cdot Va - \{r3/(r3+r4)\} \cdot VF$$

This equation can be differentiated by temperature variable T to be modified to equation (2) below.

$$\partial V2/\partial T = \partial Va/\partial T + \partial VF/\partial T \quad (2)$$

Figure 2A:
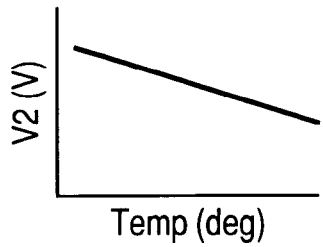
Figure 2B:
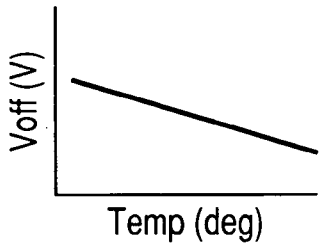

The forward voltage VF of the diode D1 indicates negative temperature characteristics. The offset provision circuit 222 contains the PN junction diode D1 whose forward voltage Vf indicates negative temperature characteristics. Accordingly, the potential V2 of the connection node N2 decreases as the temperature rises as shown in FIG. 2(A). Since this potential is applied to the non inverting input terminal of the differential amplifierAMP1, the currents I1 and I2 flowing through the MOSFET Q1 and Q2 decrease as the temperature rises as shown in FIG. 2(B). The temperature coefficient of the potential V2 for the node N2 can be adjusted to an intended value by appropriately setting a resistance ratio between the resistors R3 and R4.

Figure 2C:
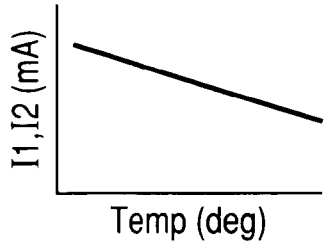
Figure 3:
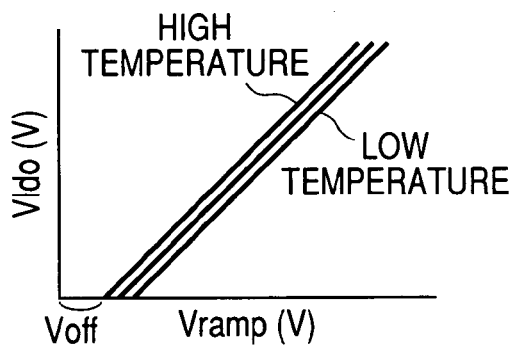
FIG. 3 is a graph showing relationship between operating power supply voltage Vldo output from the power supply circuit and output level designation signal Vramp.
Figure 4:
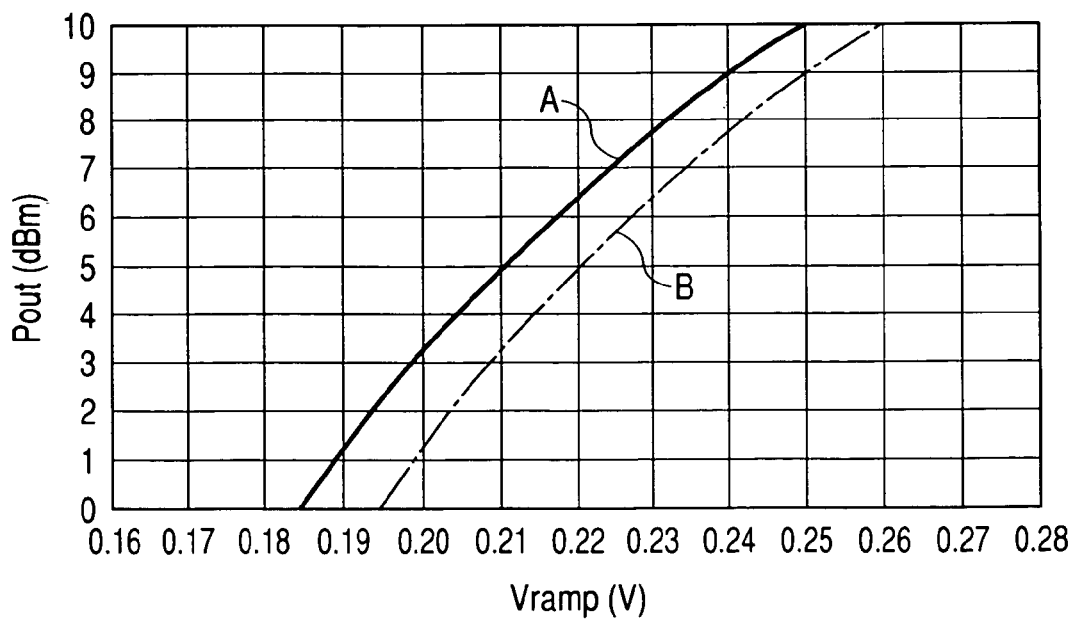
FIG. 4 is a graph showing relationship between output level designation signal Vramp and output power Pout during low output when the offset provision circuit has no temperature compensation device.

The resistor R2 of the power supply circuit 221 is supplied with the Q2 drain current I2 having the above-mentioned temperature dependency. When an offset voltage Voff is applied to the non inverting input terminal of the differential amplifier AMP0, the offset voltage Voff decreases as the temperature rises as shown in FIG. 2(C). As a result, the power supply circuit 221 outputs an operating power supply voltage Vldo. As shown in FIG. 3, increasing the temperature increases the operating power supply voltage Vldo in proportion to the output level designation signal Vramp from a relatively low level of Vramp. Decreasing the temperature increases the operating power supply voltage Vldo in proportion to the output level designation signal Vramp from a relatively high level of Vramp. That is, increasing the temperature can increase the operating power supply voltage Vldo for the same Vramp.

By contrast, when FETs are used as amplifying devices of the amplification stages 211 through 213, the saturation voltage indicates positive temperature characteristics. That is, an approximately constant difference is ensured between the operating power supply voltage Vldo and the saturation voltage irrespectively of temperature changes. As a result, an output power free from temperature dependency can be obtained from the high frequency power amplifier circuit 210 operating on the operating power supply voltage Vldo supplied from the power supply circuit 221. A power supply voltage Vreg for the offset provision circuit 222 is supplied from a switching regulator for DC-DC transformation of battery voltage or a power supply regulator such as a series regulator.

Figure 5:
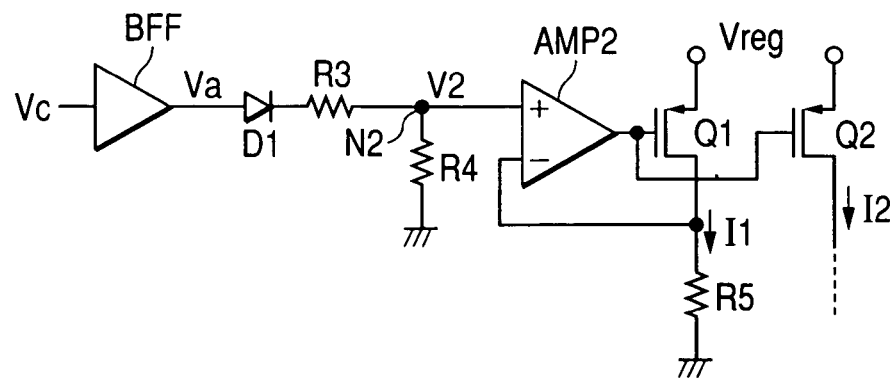
FIG. 5 is a circuit diagram showing a configuration example of the offset provision circuit when a bipolar transistor is used as an amplifying transistor.

FIG. 5 shows a configuration example of the offset provision circuit 222. In this case, amplifying transistors for the amplification stages 211 through 213 are bipolar transistors whose saturation current has temperature characteristics contrary to those of the FETs. The offset provision circuit 222 in FIG. 5 only differs from that in FIG. 1 as follows. According to the embodiment in FIG. 1, the resistor R4 and the diode D1 are serially connected between the non inverting input terminal of the differential amplifier AMP1 and the ground point. According to the embodiment in FIG. 5, the resistor R3 and the diode D1 are serially connected between the output terminal of the preceding buffer BFF and the non inverting input terminal of the differential amplifier AMP1.

In the offset provision circuit 222 according to this embodiment, the following equation is used to find V2, i.e., the potential for the connection node N2 between the resistors R3 and R4. This potential is input to the non inverting input terminal of the differential amplifier AMP1.

$$V2 = r4(Va - VF)/(r3 + r4) \quad (3)$$

$$= \{r4/(r3+r4)\} \cdot Va - \{r4/(r3+r4)\} \cdot VF$$

This equation can be differentiated by temperature variable T to be modified to equation (4) below.

$$\partial V2/\partial T = \partial Va/\partial T - \partial VF/\partial T \quad (4)$$

The forward voltage VF of the diode D1 indicates negative temperature characteristics. Accordingly, equation (4) makes it clear that increasing the temperature increases the potential V2 for the node N2, i.e., an input voltage to the non inverting input terminal of the differential amplifier AMP1. This is contrary to the embodiment in FIG. 1. As a result, the power supply circuit 221 outputs the operating power supply voltage Vldo. Decreasing the temperature increases the operating power supply voltage Vldo in proportion to the output level designation signal Vramp from a relatively low level of Vramp. Contrary to FIG. 3, increasing the temperature increases the operating power supply voltage Vldo in proportion to the output level designation signal Vramp from a relatively high level of Vramp.

By contrast, when bipolar transistors are used as amplifying devices of the amplification stages 211 through 213, the saturation voltage indicates negative temperature characteristics. That is, increasing the temperature decreases the saturation current to lower the gain and decreasing the temperature increases the saturation current to heighten the gain. When the operating power supply voltage Vldo supplied from the power supply circuit 221 varies with the temperature, the high frequency power amplifier circuit 210 provides output power characteristics void of the temperature dependency.

Figure 7:
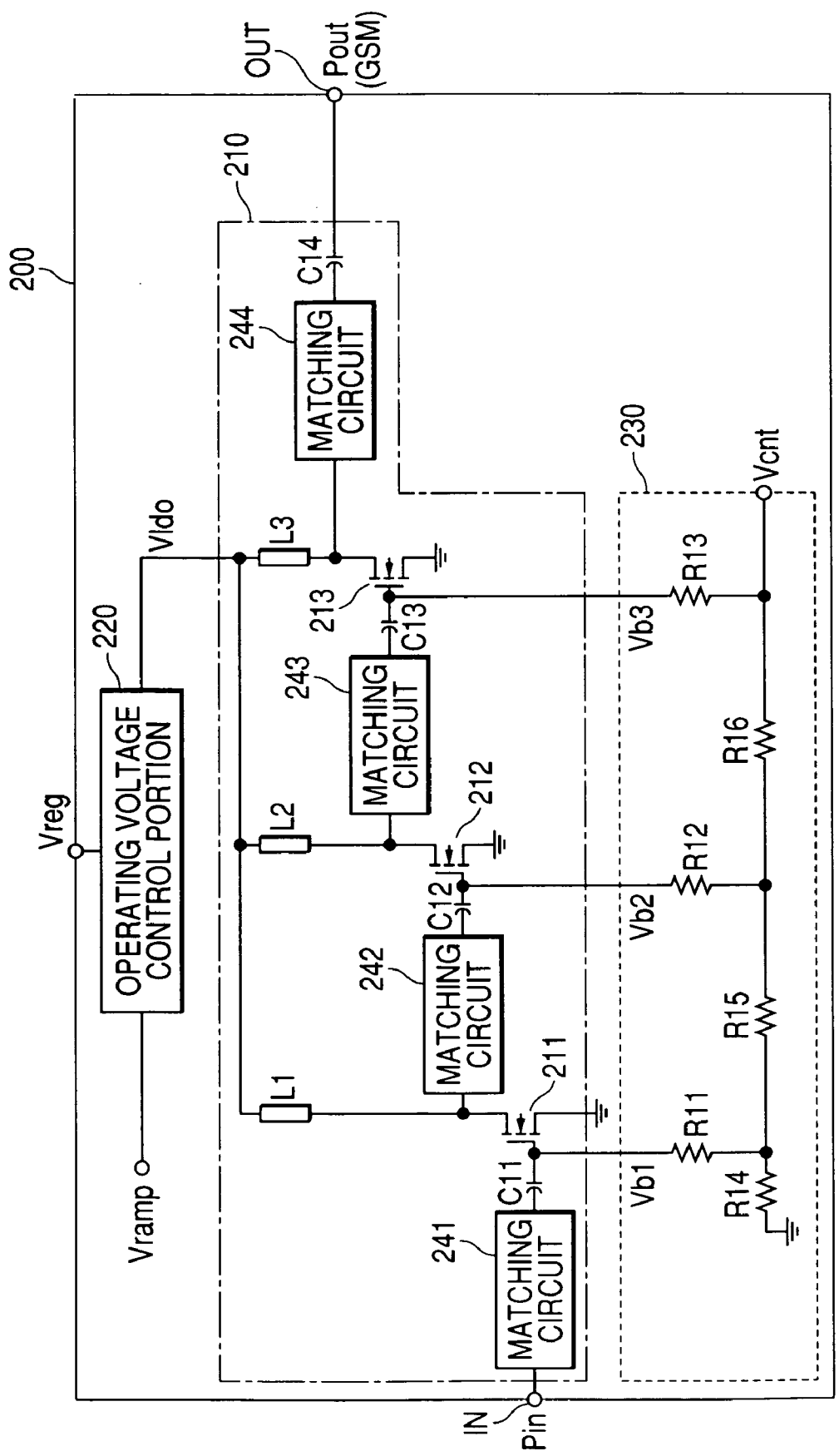
FIG. 7 is a circuit configuration diagram showing in more detail the configuration of a high frequency power amplification portion according to the present invention.

FIG. 7 shows a more detailed configuration of the high frequency power amplification portion according to the present invention.

The high frequency power amplifier circuit 210 according to the embodiment has three power amplifying FETs 211, 212, and 213. Gate terminals of the subsequent FETs 212 and 213 connect with the drain terminals of the preceding FETs 211 and 212. As a whole, the high frequency power amplifier circuit 210 is configured as a three-stage power amplifier circuit. Gate terminals of the FETs 211, 212, and 213 in each stage are applied with bias voltages Vb1, Vb2, and Vb3 (Vb1<Vb2<Vb3) supplied from the bias circuit 230. Drain currents corresponding to these voltages are applied to the FETs 211, 212, and 213.

Drain terminals of the FETs 211, 212, and 213 in each stage are applied with the operating power supply voltage Vldo from the operating power supply voltage control circuit 220 configured as shown in FIG. 1 via inductors L1, L2, and L3. There are provided an impedance matching circuit 241 and a capacitor device C11 for direct current cutting between a gate terminal and an input terminal In of the FET 211 at the first stage. A high-frequency signal Pin is input to the gate terminal of the FET 211 via these circuit and devices.

There are connected an impedance matching circuit 242 and a capacitor device C12 for direct current cutting between a drain terminal of the FET 211 at the first stage and a gate terminal of the FET 212 at the second stage. There are connected an impedance matching circuit 243 and a capacitor device C13 for direct current cutting between a drain terminal of the FET 212 at the second stage and a gate terminal of the FET 213 at the last stage. The drain terminal of the FET 213 at the last stage is connected to an output terminal OUT via an impedance matching circuit 244 and a capacitor device C14. A signal Pout is output by cutting direct current components and amplifying alternate current components in the high-frequency input signal Pin.

The bias circuit 230 is not specifically limited and is composed of resistors R11 through R16. The bias circuit 230 constructs a resistance voltage divider circuit that divides set voltage Vcnt at a specified resistance ratio to generate gate bias voltages Vb1, Vb2, and Vb3. The resistance voltage divider circuit in FIG. 7 is not accurate but is intended to provide the circuit concept. The present invention is not limited to the circuit as shown in FIG. 7. The resistors R11 through R16 constructing the bias circuit 230 are fabricated as a semiconductor integrated circuit on a single semiconductor chip along with the FETs 211, 212, and 213 of the high frequency power amplifier circuit 210 and the operating power supply voltage control circuit 220 (except the stabilization capacitor C1 and the resistor R0 and the capacitor C0 for phase compensation).

According to the embodiment, the semiconductor conductor chip is used to form the amplifying FETs 211, 212, and 213 for the high frequency power amplifier circuit 210, the operating power supply voltage control circuit 220, and the bias circuit 230. The semiconductor chip is mounted on an insulated substrate along with external devices such as the stabilization capacitor C1 and the capacitors C11 through C14 for direct current cutting to be configured as a module (hereafter referred to as an RF power module). In this specification, the module signifies the whole of multiple semiconductor chips and parts that can be handled like one electronic part. Actually, the multiple semiconductor chips and discrete parts are mounted on an insulated substrate such as a ceramic substrate with wiring printed on its surface or inside. The parts are connected with each other by means of the above-mentioned print wiring or bonding wires so as to carry out specified functions.

The inductors L1 through L3 according to the embodiment are fabricated by the bonding wires connected between semiconductor chip pads. Further, the inductors can be fabricated by micro strip lines, for example, formed on the module substrate. It may be preferable to use a separately formed semiconductor device for the amplifying FET 213 at the third stage. This allows the operating power supply voltage control circuit 220 to be hardly subject to noises generated from the amplifying FET 213 at the last stage. External devices can be used for the resistors R11 through R16.

Figure 6:
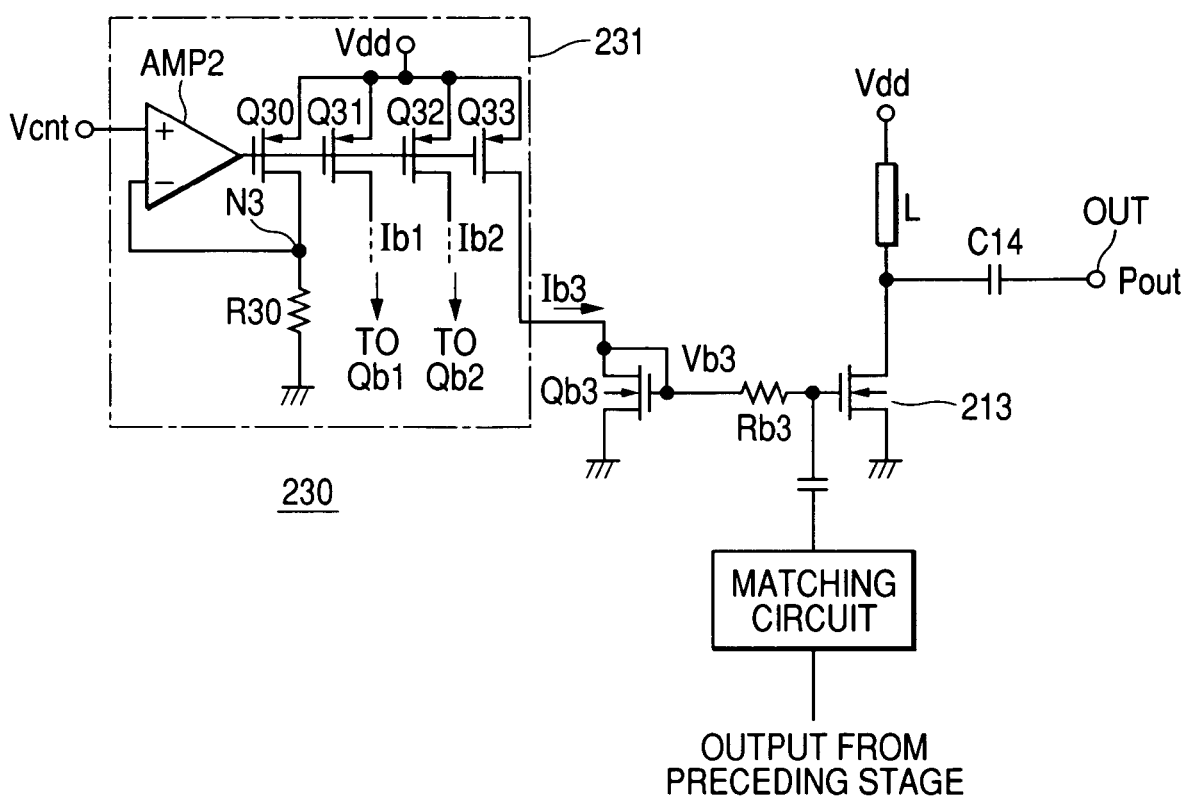
FIG. 6 is a circuit configuration diagram showing another circuit example of the bias circuit.

FIG. 6 shows another example of the bias circuit 230.

According to the embodiment, the gate terminal of the amplifying FET 213 is provided with a bias transistor Qb3 based on the current-mirror connection via a resistor Rb3. A current generation circuit 231 supplies a bias current Ib3 to the transistor Qb3. As an idle current, the amplifying FET 213 is applied with the drain current in proportion to the size ratio between the transistors Qb3 and Qa3. The preceding amplifying transistor is provided with bias transistors (Qb1 and Qb2) based on the current-mirror connection. These transistors are also applied with bias currents Ib1 and Ib2 from the current generation circuit 231. The bias circuit 230 is composed of current generation circuit 231 and the bias transistors Qb1, Qb2, and Qb3.

The current generation circuit 231 is composed of: a differential amplifier AMP2 whose non inverting input terminal receives set voltage Vcnt; MOSFET Q30 whose gate terminal receives output from the differential amplifier AMP2; a resistor R30 serially connected with Q30; and MOSFETs Q31, Q32, and Q33 to receive the same gate voltage as Q30. A potential at the connection node N3 between Q30 and R30 is fed back to an inverting input terminal of the differential amplifier AMP2. In this manner, MOSFET Q30 is driven so that the potential at the connection node N3 matches Vcnt. Q31, Q32, and Q33 are applied with a current in proportion to the set voltage Vcnt.

This current is applied as bias currents Ib1, Ib2, and Ib3 to the bias transistors Qb1, Qb2, and Qb3 in current mirror connection with the amplifying devices 211, 212, and 213. Specified size ratios are defined between the transistor Q30 and Q31, Q32, and Q33, between 211 and Qb1, between 212 and Qb2, and between 213 and Qb3. In this manner, it is possible to supply the amplifying devices 211, 212, and 213 with currents having sizes in proportion to the set voltage Vcnt. Normally, the currents are sized to be Ib1<Ib2<Ib3.

Figure 8:
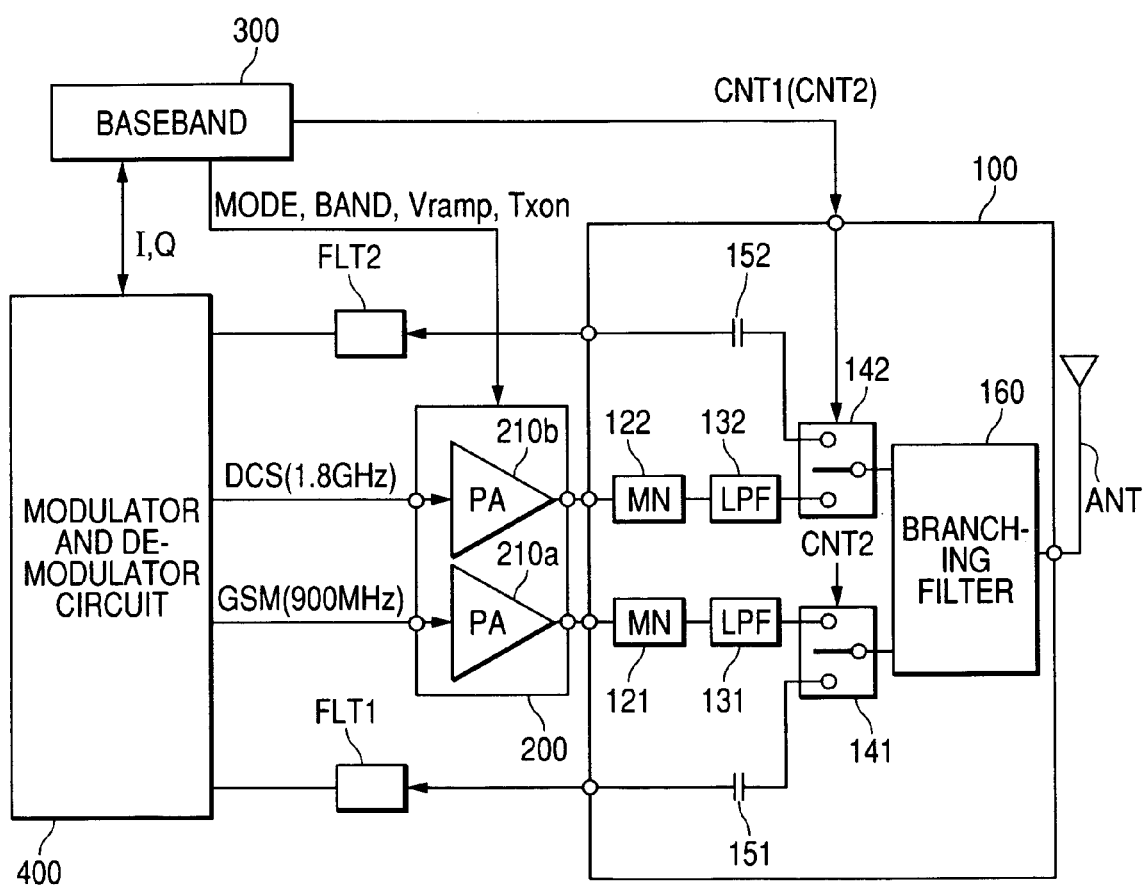
FIG. 8 is a block diagram showing an example of applying the high frequency power amplifier circuit according to the embodiment to a cellular phone system.

FIG. 8 shows an example of applying the high frequency power amplifier according to the embodiment to a cellular phone system. Though special limitations are not considered, this example is configured as a dual-band radio communication system capable of transmission and reception based on the GSM and DCS systems.

In FIG. 8, reference symbol ANT denotes an antenna to transmit and receive signal radio waves. Reference numeral 100 denotes a front end module. Reference numeral 200 denotes an RF power module to which the high frequency power amplifier according to the above-mentioned embodiment is applied. Reference numeral 300 denotes a baseband circuit that transforms an audio signal into a baseband signal, transforms a received signal into an audio signal, and generates a modulation selection signal MODE, a band selection signal BAND, and a transmission start signal TXON. Reference numeral 400 denotes a modulation and demodulation LSI that down-converts to demodulate a received signal, generates a baseband signal, and modulates a transmission signal. Reference symbols FLT1 and FLT2 denote filters that remove noises or interference waves from a received signal.

Of these components, for example, the filter FLT1 is a circuit for GSM. The filter FLT2 is a circuit for DCS. The baseband circuit 300 can be composed of multiple LSI and IC chips such as a DSP (Digital Signal Processor), a microprocessor, and semiconductor memory. Though not shown in FIG. 7, the RF power module 200 is provided with two high frequency power amplifier circuits 210a and 210b having similar configurations. The high frequency power amplifier circuit 210a amplifies GSM transmission signals using frequencies between 880 and 915 MHz. The high frequency power amplifier circuit 210b amplifies DCS transmission signals using frequencies between 1710 and 1785 MHz.

The RF power module 200 used for the example uses two bias circuits 230 and two operating power supply voltage control circuits 220 each of which are provided for the high frequency power amplifier circuits 210a and 210b. Part of the components may be shared and may be provided as common circuits. The output level designation signal Vramp may be supplied to the RF power module 200 via the modulation and demodulation LSI 400.

The front end module 100 is composed of impedance matching circuits 121 and 122, low-pass filters 131 and 132, switch circuits 141 and 142, capacitors 151 and 152, and a branching filter 160. The impedance matching circuits 121 and 122 are connected to transmission output terminals of the RF power module 200 to match impedances. The low-pass filters 131 and 132 attenuate high frequencies. The switch circuits 141 and 142 switch between transmission and reception. The capacitors 151 and 152 remove alternate current components from a received signal. The branching filter 160 branches signals into 900 MHz band GSM signals and 1.8 GHz band DCS signals. These circuits and devices are mounted on one ceramic substrate and are configured as a module. The baseband circuit 300 supplies selection signals CNT1 and CNT2 for the switch circuits 141 and 142 that switch between transmission and reception.

The use of the operating power supply voltage control circuit 220 according to the above-mentioned embodiment is not limited to GMSK modulated transmission signals containing only phase modulation components. The operating power supply voltage control circuit 220 can be also used for an EDGE (Enhanced Data Rates for GSM Evolution) compliant high frequency power amplifier circuit that amplifies 8-PSK modulated transmission signals containing phase modulation components and amplitude modulation components.

Figure 9:
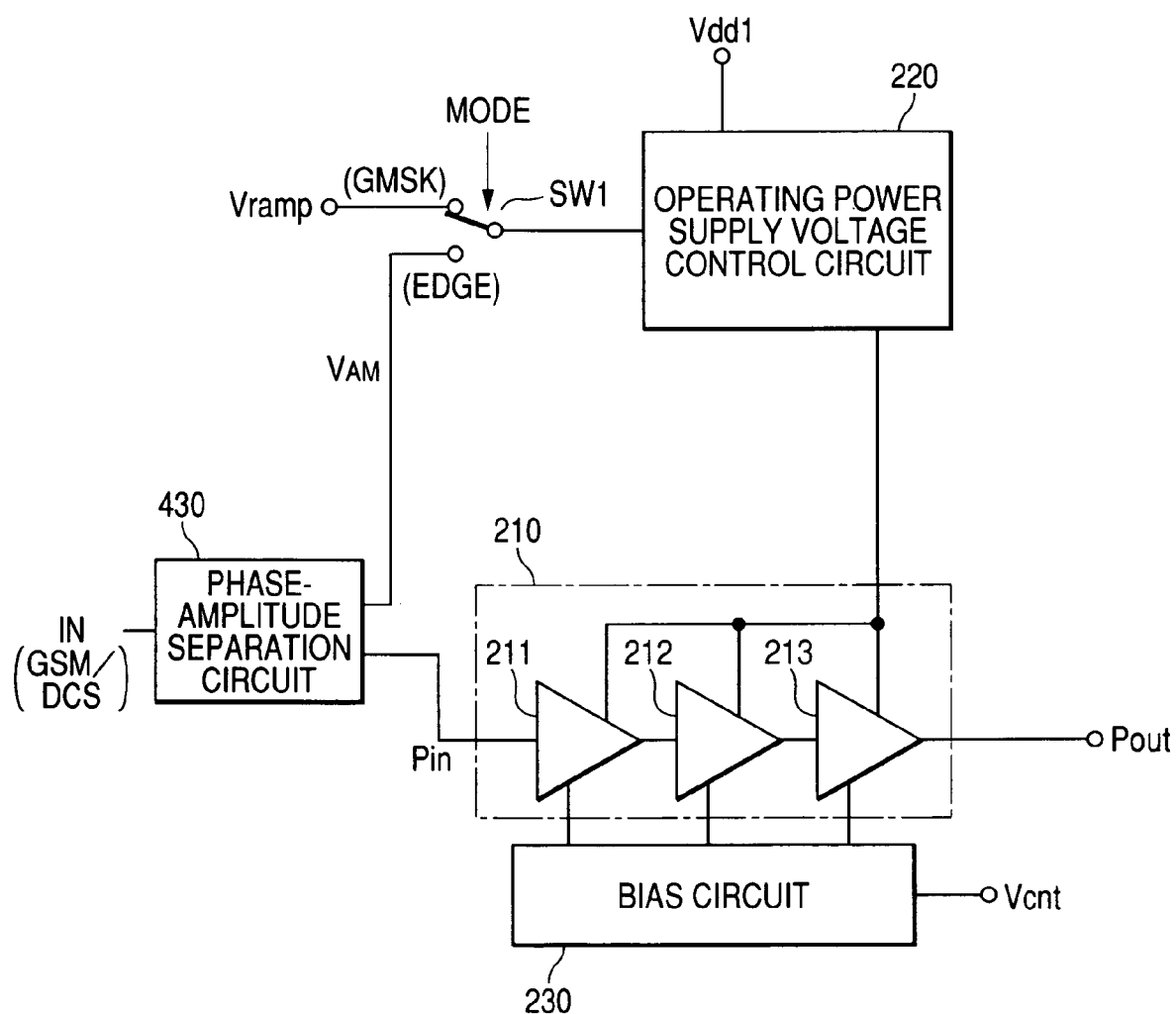
FIG. 9 is a block diagram exemplifying the configuration of an EDGE-compliant high frequency power amplifier circuit.

FIG. 9 shows a configuration example of the EDGE compliant high frequency power amplifier circuit. According to the embodiment, a phase-amplitude separation circuit 430 is provided previously to the high frequency power amplifier circuit 210. The phase-amplitude separation circuit 430 separates phase modulation components and amplitude modulation components from a transmission signal containing phase modulation components and amplitude modulation components. A selection switch SW1 is provided previously to the operating power supply voltage control circuit 220. The selection switch SW1 selects the output level designation signal Vramp from the baseband circuit or signal VAM containing amplitude components separated by the phase-amplitude separation circuit 430.

The mode signal MODE indicates the GSM or EDGE mode supplied from the baseband circuit. The GSM mode amplifies a GMSK modulated transmission signal. The EDGE mode amplifies an 8-PSK modulated transmission signal. When the mode signal MODE indicates the GSM mode, the switch SW1 selects Vramp and supplies it to the operating power supply voltage control circuit 220. When the mode signal MODE indicates the EDGE mode, the switch SW1 selects the signal VAM containing amplitude components separated by the phase-amplitude separation circuit 430 and supplies the signal VAM to the operating power supply voltage control circuit 220.

Consequently, in the GSM mode, the operating power supply voltage control circuit 220 generates the operating power supply voltage Vldo in proportion to Vramp and supplies Vldo to the high frequency power amplifier circuit 210. In the EDGE mode, the operating power supply voltage control circuit 220 generates operating power supply voltage Vldo corresponding to the signal VAM containing amplitude components and supplies Vldo to the high frequency power amplifier circuit 210. In the EDGE mode, a circuit previous to the phase-amplitude separation circuit 430 generates a transmission signal containing an amplitude corresponding to the output level designation signal Vramp. The generated transmission signal is supplied as an input signal IN to the phase-amplitude separation circuit 430. The signal Pin containing only phase modulation components is input to the high frequency power amplifier circuit 210. Accordingly, the high frequency power amplifier circuit 210 amplifies and outputs the input signal Pin in accordance with the operating power supply voltage Vldo that varies with the amplitude component VAM.

While there have been described specific preferred embodiments of the present invention made by the inventors, it is to be distinctly understood that the present invention is not limited thereto but may be otherwise variously embodied within the spirit and scope of the invention. While three stages of amplifying FETs are connected in the embodiment, for example, it may be preferable to connect two stages or four or more stages. While the embodiment uses MOSFETs for the power amplifying devices 211 through 213, it may be preferable to use the other transistors such as a bipolar transistor, GaAsMESFET, hetero junction bipolar transistor (HBT), and HEMT (High Electron Mobility Transistor).

The above-mentioned description applies the present invention made by the inventors to the power module that is the background or the field of the invention and constructs the dual mode radio communication system capable of transmission and reception based on two communication systems GSM and DCS. The present invention is not limited thereto but can be used for the other communication systems or for either GSM or DCS. Further, the present invention can be used for power modules constructing radio communication systems for multi-mode cellular phones and mobile phones capable of transmission and reception based on three or more communication systems such as PCS (Personal Communication System) ranging from 1850 to 1915 MHz bands in addition to GSM and DCS. Moreover, the present invention can be used for high frequency power amplifier circuits and power modules for wireless LANs.

What is claimed is:

1. A high frequency power amplifier circuit having an operating power supply voltage control circuit which keeps constant a bias voltage applied to an amplifying device's control terminal and controls a amplifying device's operating power supply voltage in accordance with an output level designation signal for designating a transmission output level to control output power,
    wherein said operating power supply voltage control circuit outputs an operating power supply voltage which has a specified offset voltage and operates said amplifying device in a saturation region in accordance with said output level designation signal when said output level designation signal indicates said offset voltage or higher, and
    wherein said offset voltage is generated so as to have temperature characteristics in accordance with temperature dependency of said amplifying device's saturation voltage.

2. The high frequency power amplifier circuit according to claim 1,
    wherein said operating power supply voltage control circuit has an offset provision circuit to generate said offset voltage and generates an offset voltage using temperature characteristics of a device provided for said offset provision circuit.

3. The high frequency power amplifier circuit according to claim 2,
    wherein said operating power supply voltage control circuit includes: a differential amplifier circuit which receives said offset voltage at one input terminal and receives said output level designation signal at the other input terminal; and a power supply circuit having an output transistor driven by said differential amplifier circuit.

4. The high frequency power amplifier circuit according to claim 1,
    wherein, when amplifying a transmission signal containing phase modulation components and amplitude modulation components, amplitude modulation components of said transmission signal are contained in said output level designation signal supplied to said operating power supply voltage control circuit.

5. The high frequency power amplifier circuit according to claim 1,
wherein said amplifying device is a field effect transistor and said offset voltage is set so as to decrease as the temperature increases.

6. The high frequency power amplifier circuit according to claim 1,
wherein said amplifying device is a bipolar transistor and said offset voltage is set so as to increase as the temperature increases.

7. The high frequency power amplifier circuit according to claim 1,
wherein said offset voltage is generated by using temperature characteristics of a PN-junction forward voltage.

8. The high frequency power amplifier circuit according to claim 1,
wherein said offset provision circuit includes a differential amplifier circuit and a transistor driven by said differential amplifier circuit, said differential amplifier circuit being supplied with a feedback voltage at its inverting input terminal and with a voltage corresponding to said PN-junction forward voltage at its non inverting in put terminal, and
wherein a current for said transistor is applied to a resistor to generate said offset voltage.

9. The high frequency power amplifier circuit according to claim 8,
wherein two or more resistor devices are serially connected to said PN junction, and wherein a resistance ratio of said two or more resistor devices is used to be able to adjust a temperature coefficient of said offset voltage.

10. The high frequency power amplifier circuit according to claim 1,
wherein said operating power supply voltage control circuit and said amplifying device are formed over the same semiconductor chip.

* * * * *